United States Patent [19]

McKitterick

[11] Patent Number: 5,789,781
[45] Date of Patent: Aug. 4, 1998

[54] SILICON-ON-INSULATOR (SOI) SEMICONDUCTOR DEVICE AND METHOD OF MAKING THE SAME

[75] Inventor: John Burt McKitterick, Columbia, Md.

[73] Assignee: AlliedSignal Inc., Morristown, N.J.

[21] Appl. No.: 861,189

[22] Filed: May 21, 1997

Related U.S. Application Data

[63] Continuation of Ser. No. 395,027, Feb. 27, 1995, abandoned.

[51] Int. Cl.$^6$ .................................................. H01L 27/01
[52] U.S. Cl. .................................................. 257/347; 257/350
[58] Field of Search .................................. 257/347, 349, 257/350, 351, 369

[56] References Cited

U.S. PATENT DOCUMENTS

| | | | |
|---|---|---|---|
| 4,231,051 | 10/1980 | Custode et al. | 257/387 |
| 4,493,056 | 1/1985 | Mao | 365/149 |
| 4,920,509 | 4/1990 | Hmida et al. | 364/784 |
| 4,922,246 | 5/1990 | Cormen et al. | 340/825.9 |
| 5,072,286 | 12/1991 | Minami et al. | 257/208 |
| 5,151,759 | 9/1992 | Vinal | 257/348 |
| 5,334,861 | 8/1994 | Pfiester et al. | 257/369 |
| 5,461,251 | 10/1995 | Yang et al. | 257/379 |

*Primary Examiner*—Jerome Jackson
*Assistant Examiner*—Nat Kelley
*Attorney, Agent, or Firm*—Howard G. Massung; Verne E. Kreger, Jr.

[57] ABSTRACT

An improved Silicon-On-Insulator (SOI) semiconductor device having a first and second asymmetric transistor, each having a source, a body, a gate, and a drain. The respective gates and drains of the asymmetric transistors are connected together such that a transistor pair is formed which is operable as a single symmetric transistor. An NMOS transistor pair may be connected in parallel with a PMOS transistor pair so as to form a symmetric Pass Gate.

5 Claims, 4 Drawing Sheets

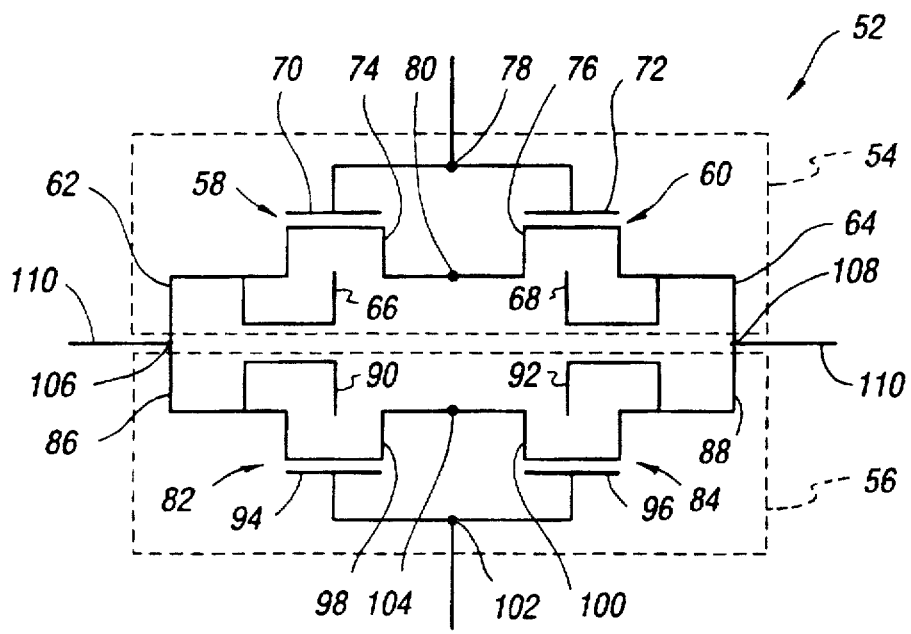

*Fig. 6*

```
┌─────────────────────────────────────────────────┐
│ PROVIDING A FIRST ASYMMETRIC TRANSISTOR          │
│ HAVING A BODY, A SOURCE CONNECTED TO             │─ 112
│ THE BODY, A GATE AND A DRAIN                     │
└─────────────────────────────────────────────────┘
                        │
                        ▼
┌─────────────────────────────────────────────────┐
│ PROVIDING A SECOND ASYMMETRIC TRANSISTOR         │
│ HAVING A SOURCE, A BODY, A GATE AND A DRAIN      │─ 114
└─────────────────────────────────────────────────┘
                        │
                        ▼
┌─────────────────────────────────────────────────┐
│ TYING THE RESPECTIVE GATES AND DRAINS OF THE FIRST │
│ AND SECOND ASYMMETRIC TRANSISTORS TOGETHER       │─ 116
└─────────────────────────────────────────────────┘
```

*Fig. 7*

SILICON-ON-INSULATOR (SOI) SEMICONDUCTOR DEVICE AND METHOD OF MAKING THE SAME

This application is a continuation of application Ser. No. 08/395,027 filed Feb. 27, 1995, now abandoned.

TECHNICAL FIELD

The present invention relates generally to Field Effect Transistors (FETs) and, more particularly, to an improved Pass Gate fabricated in Silicon-On-Insulator (SOI) material.

BACKGROUND ART

The Field Effect Transistors (FETs) used in Complementary Metal Oxide Field Effect Transistors (CMOS) are four terminal devices. As shown in FIG. 1, the four terminals of the Field Effect Transistor 10 are the source 12, the gate 14, the drain 16 and the body 18. As those skilled in the art will recognize, it is necessary for the body 18 to be connected as there are severe problems associated with leaving the body 18 floating. Not the least of these problems is that of bi-polar snap back.

In standard CMOS technology using bulk silicon wafers, the transistors are either fabricated directly on a substrate or inside of a well. In either case, the substrate or the well is connected directly to a power supply, either VSS or VDD as shown by reference numeral 20 in FIG. 1. As seen, the body of the transistor is therefore connected to VSS or VDD. This is true for all transistors, even those transistors for which it is not possible to differentiate between the source and the drain. Transistors such as these occur in logic elements known as Pass Gates. These logic elements rely on the symmetry between the source and the drain to operate.

In Field Effect Transistors fabricated in SOI material, however, the problem of tying the body to the appropriate voltage is not so easily solved. One known method is to place each transistor into a well and let the region of silicon underneath the gate material make the connection between the body and the well, thus providing the body terminal. This method essentially recreates the situation in bulk silicon, but is not an efficient solution due to the consumption of area needed for the wells and the contacts to the wells.

A second known prior art approach is to place body contacts along the source side of the gate as shown, for example, in FIGS. 2 and 3. As shown, the body 18, which is the region underneath the gate, must be contacted to prevent bad transistor characteristics such as low breakdown voltage. In SOI, the body contact must be made from the side, rather than underneath, as is possible in a normal bulk silicon technology. In FIG. 3, the source and gate sides of the transistor are depicted by reference numerals 20 and 22, respectively. The body contact is shown by reference numeral 24.

Placing the body contacts 24 where they appear in FIGS. 2 and 3 has large advantages for radiation hardness and process simplicity. Since in most digital functions the source of the transistor is known a priori, and since the source and the body should be at the same potential, it is advantageous to simply tie them together with metal as shown. Indeed, this is more space-efficient and is logically equivalent to the bulk CMOS technology for all cases except for those cases involving transistors for which it is not possible to differentiate between the source and the drain, i.e., Pass Gates which are of interest to the present invention.

In the case of Pass Gates, the body cannot be tied to either the left side of the gate or to the right side, as there will be times that the left side is at a higher potential and times that the right side is at a higher potential. What happens when the body of an NMOS transistor is tied to the side of the gate that is at a higher potential, is that the transistor conducts current, even if the gate is turned off. (In a PMOS device, this occurs when the body is connected to the side with lower potential.) In a Pass Gate, which is used to block current when desired, this behavior is definitely undesirable.

To date, the only way to create the desired logic elements, i.e. Pass Gates, involving transistors is by the method described in FIG. 1 above, i.e., by enclosing the transistors in a well. The approach described in FIGS. 2–3 above is inappropriate with FETs fabricated in SOI material since it is inherently an asymmetric technology. This asymmetry prevents an NMOS transistor from operating correctly when the source voltage is raised above the drain voltage (below the drain voltage for PMOS). In such case, the body, which is connected to the source, then becomes forward-biased and the transistor will conduct current regardless of the gate voltage.

Consequently, a need has developed for an improved Silicon-On-Insulator logic element which overcomes the limitations of the prior art.

DISCLOSURE OF THE INVENTION

It is a general object of the present invention to provide improved Silicon-On-Insulator (SOI) logic elements which provide functionality similar to logic elements in bulk CMOS technology requiring symmetry between the source and drain.

A more specific object of the present invention is the provision of an improved SOI Pass Gate which is made from asymmetric SOI transistors.

In carrying out the above-described objects of the present invention, there is provided an improved Silicon-On-Insulator (SOI) logic element, which includes first and second asymmetric transistors. Each of the asymmetric transistors has a source, a body, a gate, and a drain. The respective gates and drains of the component transistors are tied together so as to form a symmetric transistor pair which is operable as a single symmetric transistor. The symmetric transistor pair may be used in any application requiring a symmetric transistor such as, for example, a Pass Gate.

In further carrying out the above-described objects of the present invention, there is similarly provided an improved SOI Pass Gate, which includes first and second transistor pairs which are connected in parallel. Each of the component transistors making up the first and second transistor pairs is asymmetric and has a source, a body, a gate, and a drain. As in the case of the improved SOI logic element described above, the gates and drains of each of the component transistors are tied together so as form two corresponding symmetric transistor pairs. Each of the symmetric transistor pairs is operable as a single symmetric transistor. Each of the sources of the first transistor pair is connected to a respective source of the second transistor pair such that through their parallel connection, they are operable in combination as a symmetric Pass Gate.

In keeping with the invention, the Pass Gate includes an NMOS transistor pair (comprised of component NMOS asymmetric transistors) and a PMOS transistor pair (comprised of component PMOS asymmetric transistors). The NMOS and PMOS transistor pairs are connected in parallel so as to increase the amount of current that will flow through the resultant Pass Gate when the voltage difference between the two sides is low.

In operation, one transistor of each transistor pair will have a forward-biased source-to-body junction, allowing the tied drains of the NMOS pair to rise to the higher of the two voltage applied to the sources and the tied drains of the PMOS pair to fall to the lower of the two voltages applied to the sources. This will happen independent of the applied gate voltages. The other transistor of each transistor pair will either block this voltage and prevent current flow or will not block the voltage and allow current flow, depending on the applied gate voltages.

In keeping with the invention, there is further provided a method of fabricating an improved Silicon-On-Insulator (SOI) semiconductor device, which includes providing first and second asymmetric transistors. Each of the asymmetric transistors has a source, a body, a gate, and a drain. By tying the respective gates and drains of the two transistors together, a symmetric transistor pair is formed which is operable as a single symmetric transistor. Again, as indicated above, this symmetric transistor pair can then be used in any application requiring a symmetric transistor, such as, for example, a Pass Gate.

Still further, in keeping with the invention, there is also provided a method of fabricating an improved Silicon-On-Insulator (SOI) Pass Gate which includes providing first, second, third, and fourth asymmetric transistors. Each of the asymmetric transistors has a source, a body, a gate, and a drain. By tying the respective gates and drains of the first and second transistors together, a first transistor pair is formed which is operable as a single symmetric transistor. Similarly, by tying the gates and drains of the third and fourth transistors together, a second transistor pair is formed which is operable as a single symmetric transistor. In the preferred embodiment, the first and second transistors are NMOS and thus form an NMOS transistor pair which is operable as a single symmetric transistor. Similarly, the third and fourth transistors are PMOS and form a PMOS transistor pair which is likewise operable as a single symmetric transistor.

Thereafter, each of the sources of the NMOS transistor pair are connected to a respective source of the PMOS transistor pair such that the NMOS and PMOS transistor pairs are connected in parallel and are operable in combination as a symmetric Pass Gate. More specifically, in operation, one transistor of each transistor pair will have a forward-biased source-to-body junction, allowing the tied drains of the NMOS transistor pair to rise to the higher of the two voltages applied to the sources and the tied drains of the PMOS transistor pair to fall to the lower of the two voltages applied to the sources. This will happen independent of the applied gate voltages. The other transistor of each transistor pair will either block this voltage and prevent current flow or will not block the voltage and allow current flow, depending upon the applied gate voltages.

These and other objects from the features and advantages of the present invention will become more readily apparent by reference to the following drawings in which like-referenced numerals correspond to like-components.

BRIEF DESCRIPTION OF THE DRAWINGS

FIG. 6 is a circuit diagram of an improved SOI Pass Gate formed with the improved semiconductor device of FIGS. 4 and 5;

FIG. 7 is a flow diagram of the method steps of fabricating the improved SOI semiconductor device of FIGS. 4 and 5.

BEST MODES FOR CARRYING OUT THE INVENTION

Figure 1:
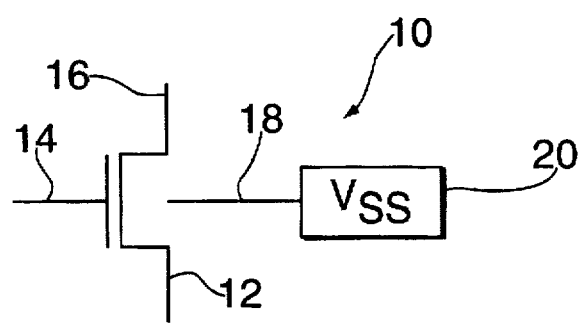
FIG. 1 is a schematic diagram of a prior art NMOS transistor in bulk silicon.
Figure 2:
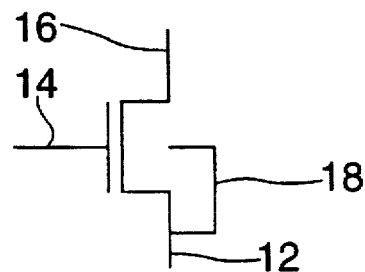
FIG. 2 is a schematic diagram of a prior art SOI-NMOS field effect transistor.
Figure 3:
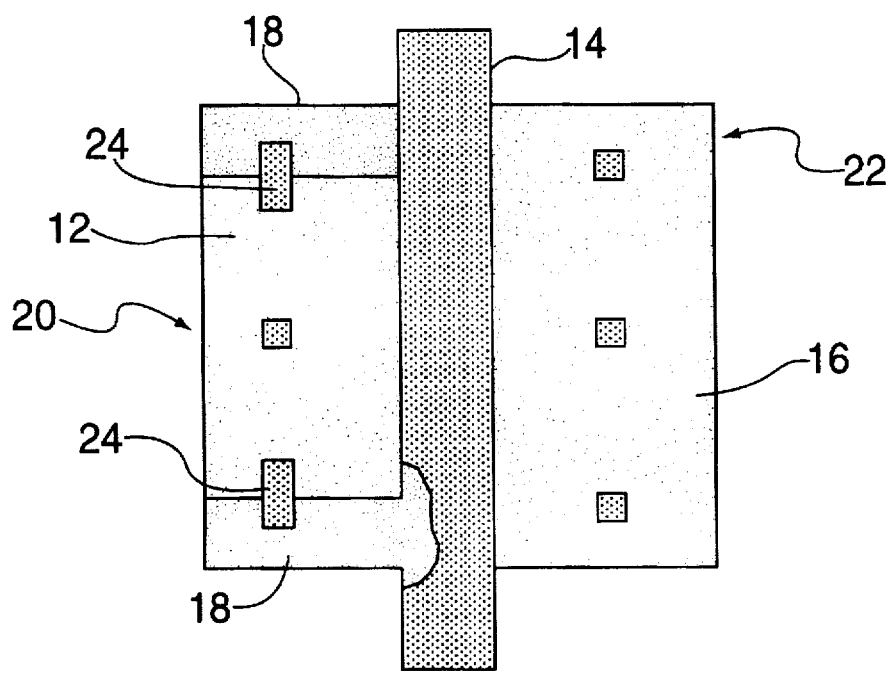
FIG. 3 is a schematic layout of the prior art NMOS field effect transistor of FIG. 2.
Figure 4:
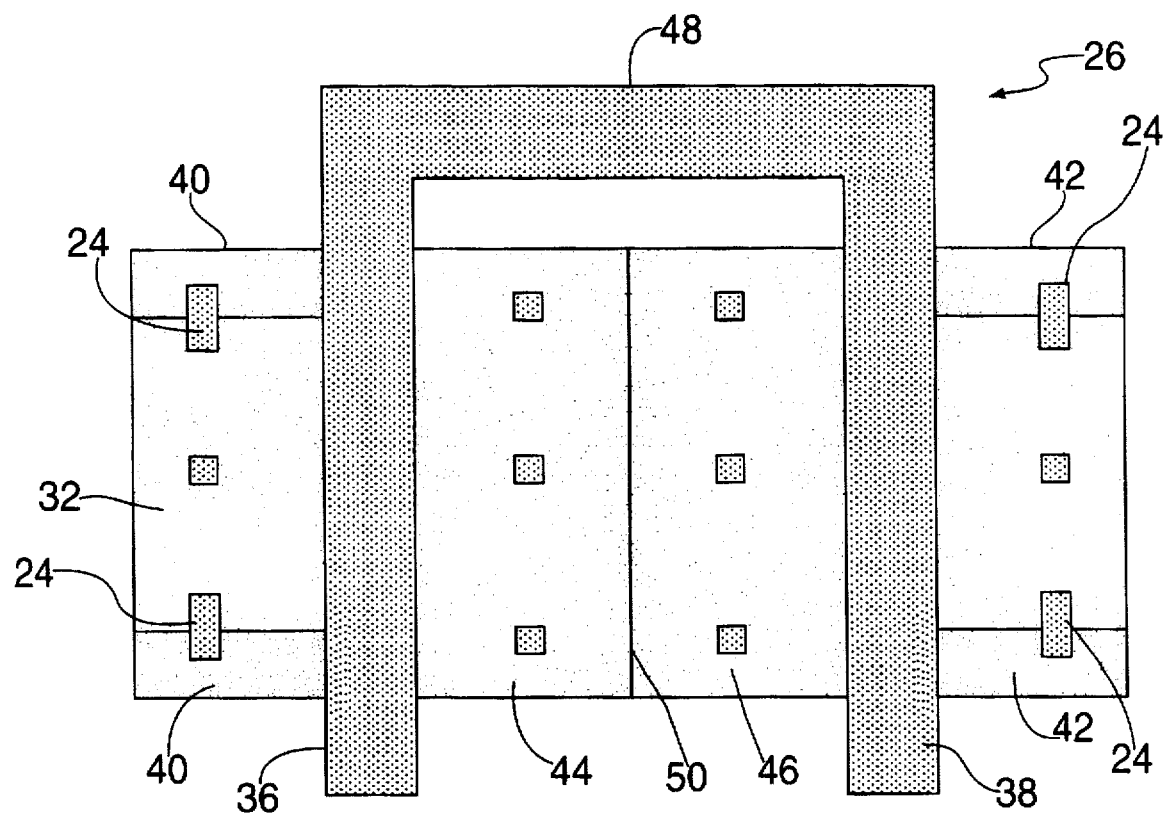
FIG. 4 is a schematic diagram of the improved Silicon-On-Insulator (SOI) semiconductor device of the present invention.

FIG. 4 is a schematic diagram of an improved SOI semiconductor device 26 of the present invention. A corresponding circuit diagram of the semiconductor device 26 of FIG. 4 is shown in FIG. 5.

Figure 5:
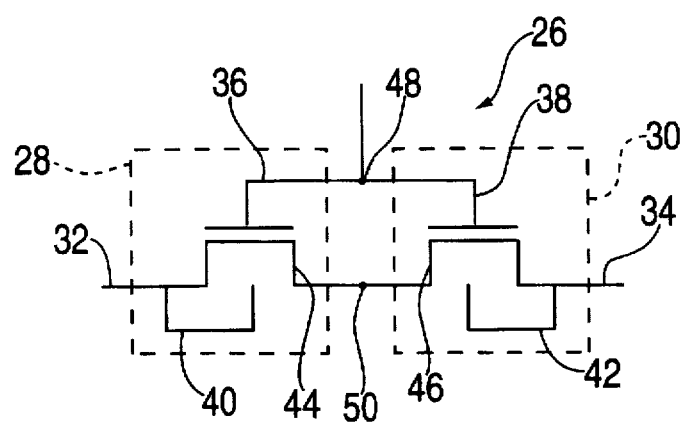
FIG. 5 is a circuit diagram of the improved SOI semiconductor device of FIG. 4.

Referring to FIG. 5, the SOI semiconductor device 26 includes first and second asymmetric transistors 28 and 30 having respective sources 32 and 34, gates 36 and 38, bodies 40 and 42, and drains 44 and 46. The gates 36 and 38 are connected at common node 48 and drains 44 and 46 are connected at common node 50. The resultant semiconductor device 26 is a symmetric transistor pair formed by transistors 28 and 30 and is operable as a single symmetric transistor. Symmetric transistor pair 26 may be used in any application requiring a symmetric transistor such as, for example, a Pass Gate.

Turning now to FIG. 6 of the drawings, there is illustrated an improved Pass Gate 52 formed in accordance with the teachings of the present invention. Pass Gate 52 is comprised of symmetric transistor pairs 54 and 56 of the type shown and described in FIGS. 4 and 5.

As shown in FIG. 6, transistor pairs 54 and 56 each have their respective gates and drains tied together such that they are operable as a single symmetric transistor. For example, transistor pair 54 is comprised of asymmetric NMOS transistors 58 and 60. Each of the transistors 58 and 60 include respective sources 62 and 64, bodies 66 and 68, gates 70 and 72, and drains 74 and 76. The gates 70 and 72 are tied together at node 78. Similarly, drains 74 and 76 are tied together at node 80. As in the case of the improved SOI semiconductor device shown in FIGS. 4 and 5 above, NMOS transistor pair 54 is operable as a single symmetric transistor.

Still referring to FIG. 6 of the drawings, a second PMOS transistor pair 56 is shown made up of component PMOS transistors 82 and 84. Again, the PMOS transistors each include a source 86 and 88, a body 90 and 92, a gate 94 and 96, and a drain 98 and 100. The gates 94 and 96 are tied together at node 102. Similarly, drains 98 and 100 are tied together at node 104. PMOS transistor pair 56, like NMOS transistor pair 54, is operable as a single symmetric transistor.

To complete the parallel connection between the first and second transistor pairs 54 and 56, each of the sources of the NMOS transistor pair 54 are connected to a corresponding source of the PMOS transistor pair 56. Thus, source 62 is shown connected to source 86 at node 106. Similarly, sources 64 and 88 are connected together at node 108. In this manner, transistor pairs 54 and 56 are connected in parallel and are operable in combination as a symmetric Pass Gate.

In operation, one transistor of each of the transistor pairs 54 and 56 will have a forward-biased source-to-body junction, allowing the tied drains 74 and 76 of the NMOS transistor pair 54 to rise to the higher of the two voltages applied to the sources and the tied drains 98 and 100 of the PMOS transistor pair 56 to fall to the lower of the two voltages applied to the sources. This will happen independent of the applied gate voltages. The other transistor of each transistor pair of 54 and 56 will either block this voltage and prevent current flow or will not block the voltage and allow current flow, depending upon the applied gate voltages.

Because the external connections 110 of the structure go to the sources (62, 64, 86, 88) of each of the transistor pairs 28 and 30, there are no problems associated with having the voltage applied to the drain of the NMOS transistor less than that of the source. As seen, by putting the component transistors together and tying their respective drains, the pair of transistors can be used in combination as a single symmetric transistor. Now, no matter which side is higher in potential, one of the two paired transistors will leak current, and the other will not. The net result is that the two component asymmetric transistors operate together in the same fashion as a single symmetric transistor—without giving up the advantages of symmetric transistors identified above.

Still referring to FIG. 6, in operation, if the voltage applied to the source of one component transistor of the NMOS transistor pair is less than the voltage applied to the source of the other component transistor, then the component transistor with the lower source will act as a normal transistor. The other transistor will have a forward-biased junction, allowing the shared drain node to rise to the higher of the two voltages. Thus, in the example shown, if the voltage applied to source 62 of transistor 58 is less than the voltage applied to source 64 of transistor 60, then transistor 58 will act as a normal transistor. Conversely, transistor 60 will have a forward-biased junction allowing the shared drain node 80 to rise to the higher of the two voltages.

In contrast, if the voltage applied to the source of one of the component transistors of the PMOS transistor pair 56 is less than the voltage applied to the source of the other component transistor, then the component transistor with the higher source voltage will operate as a normal transistor. Thus, in the example shown, if source 86 of PMOS transistor pair 56 has a lower applied voltage than source 88, transistor 84 will operate as a normal transistor.

A significant advantage of the improved semiconductor device is that only one type of transistor is needed to make a full CMOS circuit, including Pass Gates. More specifically, it is not necessary to make transistors with well-isolation in addition to those with bodies tied to the source. An additional problem with the well-isolated transistors is the necessity to avoid shorting the well to the source or drain when the process includes a self-aligned silicide. Applicants' novel semiconductor structure permits use of only transistors with bodies tied to the source. Self-aligned silicides will have only positive effects on the area and performance of the transistors and logic elements made up of these transmissions.

The steps of fabricating the improved semiconductor device are illustrated in further detail by reference to FIG. 7. This method includes the provision 112, 114 of first and second asymmetric transistors. Again, each of the asymmetric transistors includes a source, a body, a gate, and a drain. By tying the respective gates and drains of the first and second symmetric transistors together 116, a symmetric pair may be formed which is operable as a single symmetric transistor.

Figure 8:
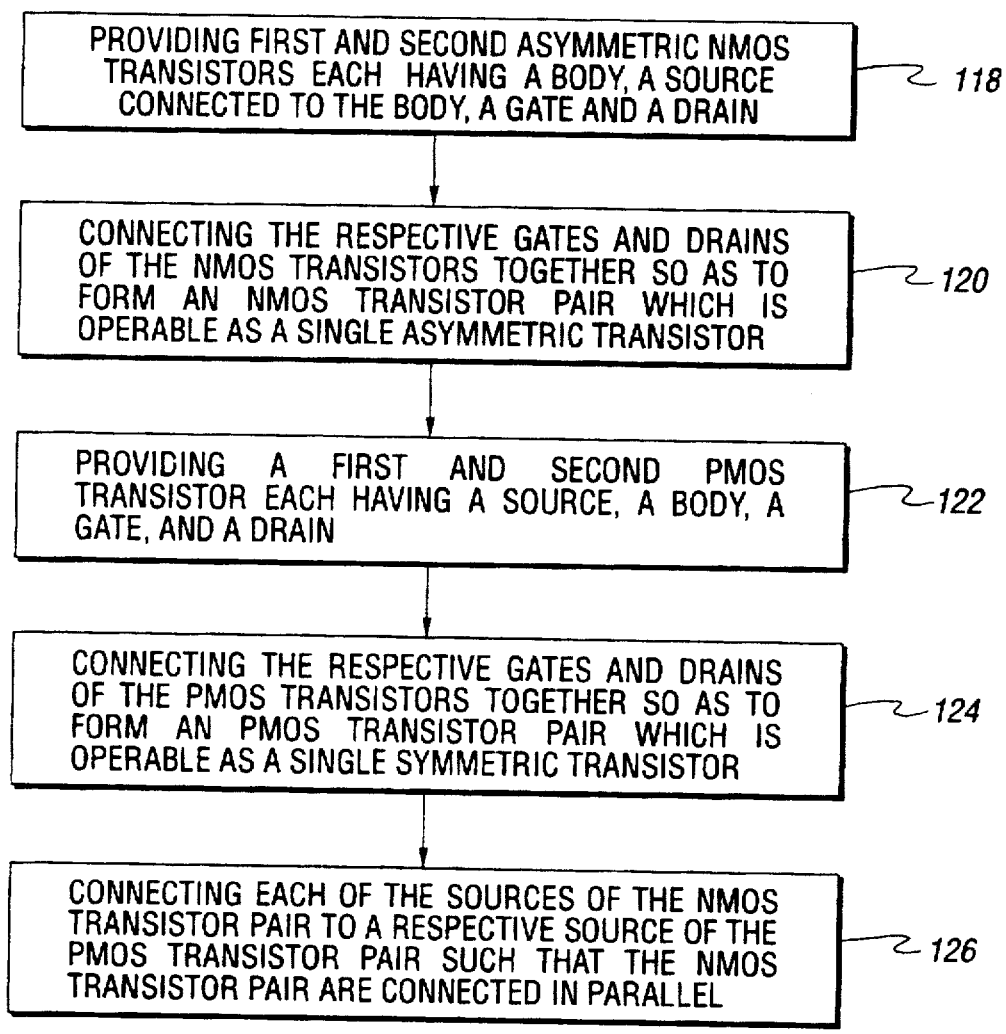
FIG. 8 is a flow diagram of the method steps of fabricating an improved SOI Pass Gate with the semiconductor devices (symmetric SOI transistors) of FIGS. 4–5.

Referring now to FIG. 8, there is further illustrated the method of forming an improved SOI Pass Gate. As shown, the method includes the provision 118 of first and second asymmetric NMOS transistors on an SOI substrate. Again, each of the NMOS transistors includes a source, a body, a gate, and a drain. The respective gates and drains of the first and second NMOS transistors may thereafter by tied together 120, so as to form a first NMOS transistor pair which is operable as a single symmetric transistor.

The method further includes the provision 122 of first and second asymmetric PMOS transistors on the same SOI substrate. Again, each of the PMOS transistors includes a source, a body, a gate, and a drain. The respective gates and drains of the PMOS transistors are thereafter tied together 124, so as to form a PMOS transistor pair which, like the NMOS transistor pair, is operable as a single symmetric transistor.

By connecting 126 each of the sources of the NMOS transistor pair to a respective source of the PMOS transistor pair, the pairs are connected in parallel and will be operable in combination as a symmetric Pass Gate as described in detail above. Both an NMOS and a PMOS transistor pair are connected in parallel so as to increase the amount of current that will flow through the Pass Gate when the voltage difference between the two transistor pairs is low.

While the best modes for carrying out the invention have been described in detail, those familiar with the art to which this invention relates will recognize alternative designs and embodiments for practicing the invention as defined by the following claims.

What is claimed is:

1. An improved Silicon-On-Insulator (SOI) semiconductor device, comprising:

a first asymmetric transistor having a first source, a body, a gate, and a drain wherein said body is tied to said first source;

a second asymmetric transistor having a second source, a body, a gate, and a drain, wherein said body is tied to said second source and said gates and drains of the first and second asymmetric transistors being tied together such that the asymmetric transistors are operable in combination as a single symmetric transistor whereby the first and second sources serve as a source and drain of said semiconductor device.

2. An improved Silicon-On-Insulator (SOI) Pass Gate, comprising:

a first asymmetric transistor pair, each transistor of said first transistor pair having a source, a body, a gate, and a drain, wherein each of said bodies is tied to its respective source and said gates and drains of said transistors of said first transistor pair being tied together, respectively, and operable as a single symmetric transistor; and a second transistor pair, each transistor of said second transistor pair having a source, a body, a gate, and a drain, wherein each of said bodies is tied to its respective source and said gates and drains of said transistors of said second transistor pair being tied together, respectively, and operable as a single symmetric transistor, each of the sources of the first transistor pair further connected to a respective source of the second transistor pair such that the first and second transistor pairs are connected in parallel and operable in combination as a symmetric Pass Gate.

3. The improved SOI semiconductor device as in claim 2, wherein each transistor of said first transistor pair is an NMOS transistor.

4. The improved SOI semiconductor device as in claim 2, wherein each transistor of said second transistor pair is a PMOS transistor.

5. An improved Silicon-On-Insulator (SOI) Pass Gate, comprising:

a first transistor pair having a first asymmetric NMOS transistor and a second asymmetric NMOS transistor, each of said first and second NMOS transistors having a source, a body, a gate, and a drain, said gates of said asymmetric NMOS transistors being tied together, and said drains of said asymmetric NMOS transistors being tied together, such that said first and second asymmetric NMOS transistors are operable as a single symmetric transistor; and a second transistor pair having a first asymmetric PMOS transistor and a second asymmetric PMOS transistor, each of said PMOS transistors having a source, a body, a gate, and a drain, said gates of said PMOS transistors being tied together, and said drains of said PMOS transistors tied together, such that said first and second asymmetric PMOS transistors are operable as a single symmetric transistor, each of the sources of said first and second NMOS transistors is further connected to a respective source of said first and second PMOS transistors such that the first and second transistor pairs are connected in parallel and operable in combination as a symmetric Pass Gate.

* * * * *